US007414553B1

(12) United States Patent
Tsyrganovich

(10) Patent No.: US 7,414,553 B1
(45) Date of Patent: Aug. 19, 2008

(54) MICROCONTROLLER HAVING IN-SITU AUTOCALIBRATED INTEGRATING ANALOG-TO-DIGITAL CONVERTER (IADC)

(75) Inventor: Anatoliy V. Tsyrganovich, San Jose, CA (US)

(73) Assignee: ZiLOG, Inc., San Jose, CA (US)

( * ) Notice: Subject to any disclaimer, the term of this patent is extended or adjusted under 35 U.S.C. 154(b) by 0 days.

(21) Appl. No.: 11/601,003

(22) Filed: Nov. 17, 2006

(51) Int. Cl.
*H03M 1/06* (2006.01)

(52) U.S. Cl. .................. 341/118; 341/120; 341/128; 341/129; 341/164; 341/165

(58) Field of Classification Search .............. 341/118, 341/120, 166–168
See application file for complete search history.

(56) References Cited

U.S. PATENT DOCUMENTS

| | | | | |
|---|---|---|---|---|
| 3,849,775 A * | 11/1974 | Buchanan et al. | ........... | 341/116 |
| 4,364,028 A * | 12/1982 | Masuda et al. | .............. | 341/118 |
| 4,849,757 A * | 7/1989 | Krenik | ........................ | 341/167 |
| 4,939,520 A * | 7/1990 | Biglow | ........................ | 341/167 |
| 5,101,206 A * | 3/1992 | Riedel | ........................ | 341/156 |
| 5,128,676 A * | 7/1992 | Ordway | ..................... | 341/167 |
| 5,157,400 A * | 10/1992 | Bang | .......................... | 341/166 |
| 5,184,128 A * | 2/1993 | Snow | ......................... | 341/128 |
| 5,216,426 A * | 6/1993 | Ishioka | ........................ | 341/168 |
| 6,384,760 B1 * | 5/2002 | Fuhrman | ..................... | 341/128 |
| 6,816,102 B2 * | 11/2004 | Pavicic | ........................ | 341/155 |
| 6,906,648 B1 * | 6/2005 | Koike | .......................... | 341/118 |
| 7,038,610 B2 * | 5/2006 | Yamamoto et al. | .......... | 341/167 |
| 7,064,694 B1 * | 6/2006 | Male et al. | .................. | 341/129 |

* cited by examiner

*Primary Examiner*—Khai M Nguyen
(74) *Attorney, Agent, or Firm*—Imperium Patent Works; T. Lester Wallace; Darien K. Wallace

(57) ABSTRACT

A microcontroller has an integrating analog-to-digital converter (IADC) with an in-situ autocalibrating functionality. On-chip autocalibrating circuitry supplies a first predetermined analog input voltage to the IADC and obtains a first data value from the IADC. The autocalibrating circuitry supplies a second predetermined analog input voltage to the IADC and obtains a second data value. The first and second data values are used to calibrate the IADC such that if the first input voltage is later supplied to the IADC, then the IADC will output a first predetermined desired digital output value and such that if the second input voltage is later supplied to the IADC, then the IADC will output a second predetermined desired digital output value. The first and second analog input voltages are generated on-chip so the calibration is performed automatically without having to supply external calibrating signals to the microcontroller. Other related methods and circuitry is disclosed.

21 Claims, 8 Drawing Sheets

INTEGRATOR WITH RESET

LINEAR RANGE OF
VIN TO IOUT RELATIONSHIP OF THE INTEGRATOR

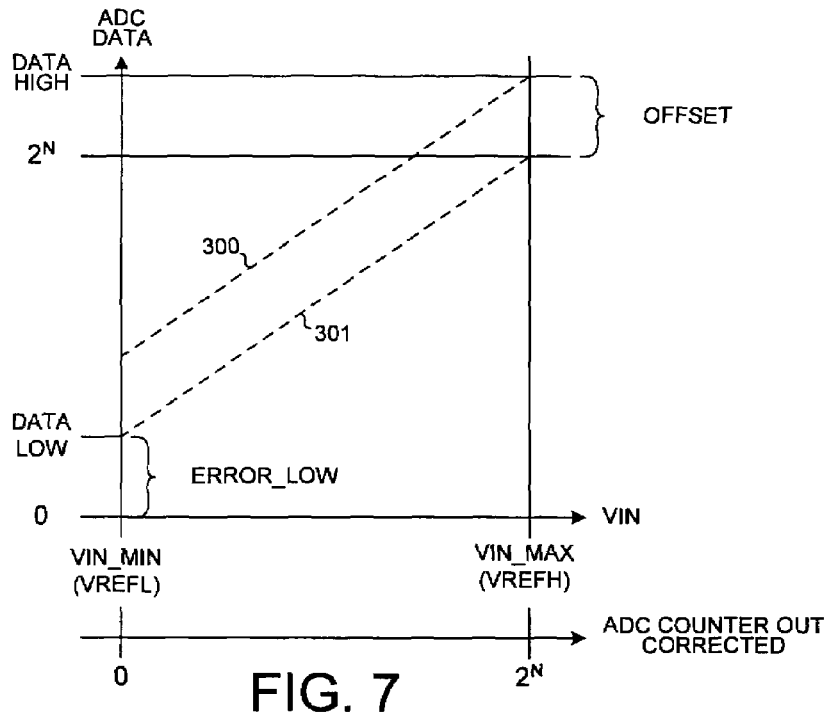
FIG. 7
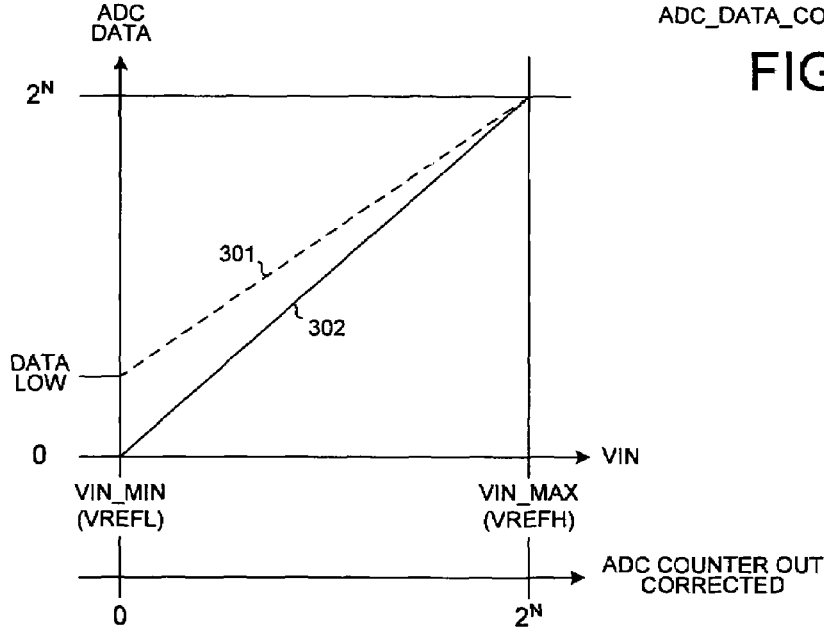
FIG. 8
$$CAL = ERROR\_LOW * (2^N - DATA)/(2^N - ERROR\_LOW)$$
$$ADC\_DATA\_COR = DATA - CAL$$
FIG. 9

MICROCONTROLLER HAVING IN-SITU AUTOCALIBRATED INTEGRATING ANALOG-TO-DIGITAL CONVERTER (IADC)

TECHNICAL FIELD

The present invention relates to microcontrollers and analog-to-digital converters (ADC).

BACKGROUND

There is heavy competition in the microcontroller market. Microcontroller manufacturers tend to monitor each other's product lines carefully and tend to provide microcontrollers having similar types of circuitry. A type of thinking prevails that seems to cause the various microcontroller manufacturers to provide similar types of circuitry because the competition provides that same type of circuitry. For example, contemporary microcontrollers typically include an analog-to-digital converter (ADC) and that ADC is typically either a successive approximation register (SAR) ADC, a sigma-delta ADC, or a sub-ranging ADC. Other types of ADCs are known such as, for example, flash ADCs, and integrating ADCs, but contemporary microcontrollers generally do not provide ADCs of these types. Sub-ranging ADCs are complex and therefore often involve substantial circuitry and therefore add significant cost to the microcontroller. SAR ADCs are fast, but are not particularly noise immune. Resolution is therefore typically low in the seven-bit to eight-bit range. Sigma-delta ADCs provide higher resolution, but are comparatively slow. In some applications, such as some motor control applications, a faster ADC is desired that is also relatively inexpensive and easy to implement.

SUMMARY

A microcontroller integrated circuit has an integrating analog-to-digital converter (IADC) with an in-situ autocalibrating functionality. In one embodiment, on-chip autocalibrating circuitry supplies a first predetermined analog input voltage (for example, VREFH) to the IADC and obtains a first data value from the IADC. The autocalibrating circuitry supplies a second predetermined analog input voltage (for example, VREFL) to the IADC and obtains a second data value. The first and second data values are used to calibrate and control the IADC such that if the first input voltage is later supplied to the IADC, then the IADC will output a first predetermined desired digital output value (for example, $2^N$) and such that if the second input voltage is later supplied to the IADC, then the IADC will output a second predetermined desired digital output value (for example, zero). In one example, the first and second analog input voltages are generated by an on-chip voltage reference generator circuit so that the calibration can be performed automatically without having to supply external calibrating signals to the microcontroller. The first and second predetermined analog input voltages may be chosen so that they roughly bound a linear input voltage operating range of a voltage-controlled current source integrator within the IADC. After IADC calibration, the integrator is operated in its linear operating range and is not operated in non-linear operating ranges above and below the linear input voltage operating range.

The self-calibrating technique disclosed can be extended to include supplying more than two predetermined analog input voltages into the IADC for calibration purposes. Also, in one example, only a single predetermined analog input voltage is used in the self-calibrating technique. In such a case, the transfer function of the current source of the integrator is broken into two parts (rather than three or more parts) and normal IADC operation occurs with the current source operating in the more linear of the two parts. The processing required to perform the autocalibration function can be realized largely in hardware, or largely in software, or in various combinations of hardware and software. The in-situ calibration function can be initiated periodically in an operating microcontroller between successive analog-to-digital conversions so that the integrating ADC will be recalibrated to take into account changing parameters that affect the accuracy of the ADC conversions (for example, temperature changes and supply voltage changes).

Not only is a novel self-calibrating ADC disclosed, but also in a broader sense the inclusion of integrating ADCs into microcontrollers is taught. Calibration techniques other than the specific calibration technique described above involving an OFFSET and a SCALING FACTOR can be employed to calibrate an integrating ADC within a microcontroller in accordance with another novel aspect.

Other methods and circuits and embodiments and advantages and considerations are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIGS. 7 and 8 are diagrams that illustrate the in-situ calibration process used to calibrate the integrating ADC of FIG. 5. FIG. 7 illustrates subtraction of the OFFSET. FIG. 8 illustrates application of the SCALING FACTOR.

FIG. 9 sets forth an equation for how to determine the scaling factor that is loaded into register 215 of FIG. 5. The term "scaling" encompasses the operation depicted in FIG. 8.

DETAILED DESCRIPTION

Figure 1:
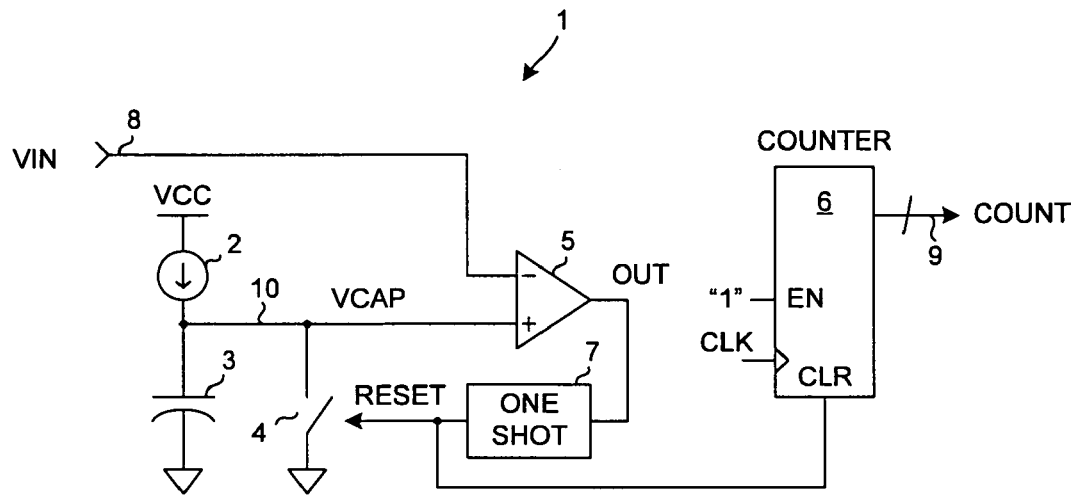
FIG. 1 is a simplified diagram of an integrating ADC.

FIG. 1 is a simplified diagram of an integrating analog-to-digital converter (an IADC) 1. IADC 1 includes a fixed current source 2, a capacitor 3, a switch 4, a comparator 5, an up counter 6, and a one-shot circuit 7. IADC 1 receives an input voltage VIN on input lead 8 and converts it into a digital value COUNT that is output on output leads 9. Current source 2, capacitor 3, and switch 4 together form an integrator that has a reset input lead.

Figure 2:
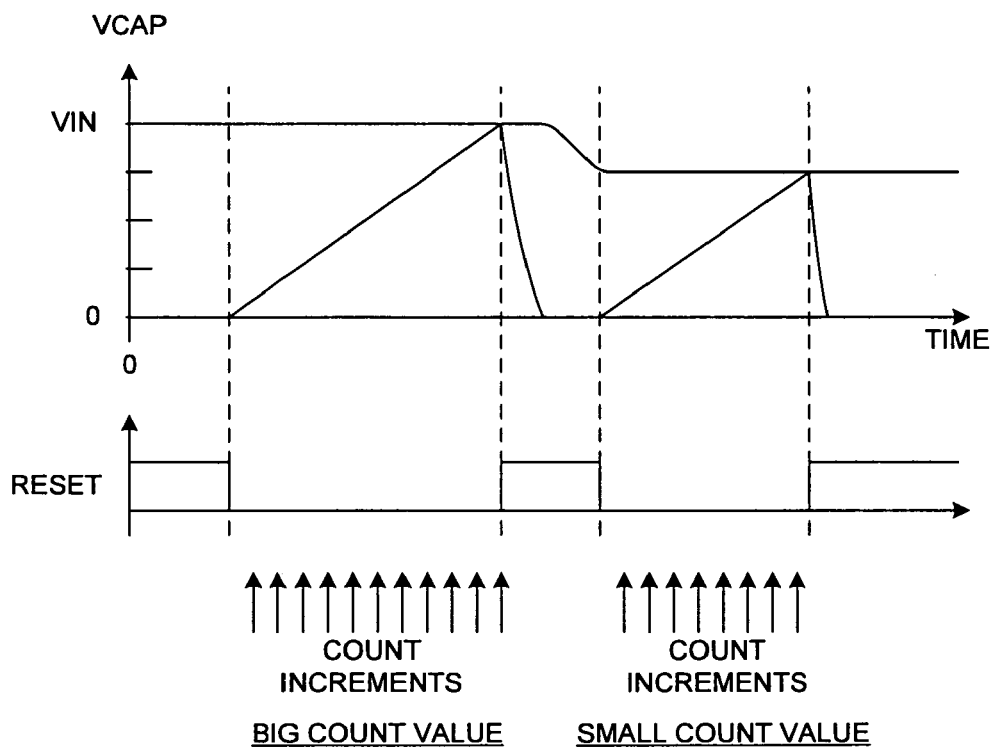
FIG. 2 is a simplified waveform diagram that illustrates an operation of the integrating ADC of FIG. 1.

FIG. 2 illustrates an operation of IADC 1. Initially the signal RESET is a digital logic high. Switch 4 is therefore closed, and node 10 is coupled to ground potential. Voltage VCAP on node 10 is at ground potential. After a time, one-shot circuit 7 deasserts the signal RESET to a digital logic low, thereby opening switch 4 and removing the signal from the clear input lead CLR of the counter 6. Counter 6 begins to count up from count zero and current source 2 begins to charge capacitor 3. As capacitor 3 charges, the voltage VCAP on node 10 increases as illustrated in FIG. 2. The slope of the increase is determined by the current sourced by current source 2 and by the capacitance of capacitor 3. This situation persists until VCAP reaches the input voltage VIN. When VCAP reaches VIN, then comparator 5 switches the digital logic value of the signal OUT from a digital logic high to a digital logic low. This triggers one-shot 7, and causes one-shot 7 to output another high pulse of a predetermined duration. The maximum count value COUNT at this time is proportional to an amount of time required for voltage VCAP to rise from ground potential to VIN. Larger VIN voltages generate larger COUNT values, and smaller VIN voltages generate smaller COUNT values. The waveforms of FIG. 2 illustrate a first ADC conversion where a larger VIN voltage results in a larger count value COUNT, followed by a second ADC conversion where a smaller VIN voltage results in a smaller count value COUNT.

Figure 3:
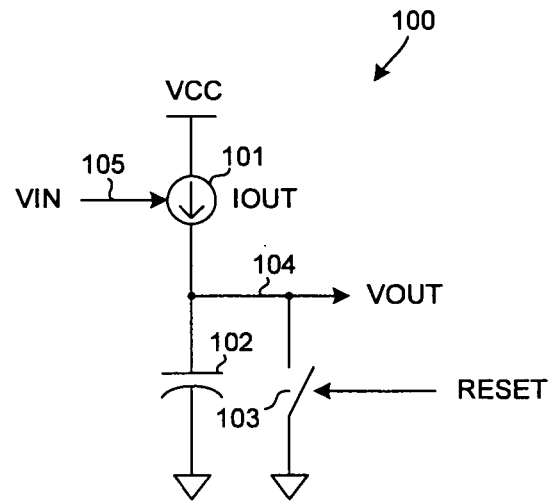
FIG. 3 is a simplified diagram of an integrator involving a voltage-controlled current source that charges a capacitor.

FIG. 3 is a diagram of another type of integrator 100 having a reset input lead. Integrator 100 involves a voltage-controlled current source 101, a capacitor 102, and a switch 103. The magnitude of current IOUT supplied by current source 101 onto node 104 is a function of the voltage VIN on input lead 105. The larger the voltage VIN, the larger the current IOUT. The smaller the voltage VIN, the smaller the current IOUT.

Figure 4:
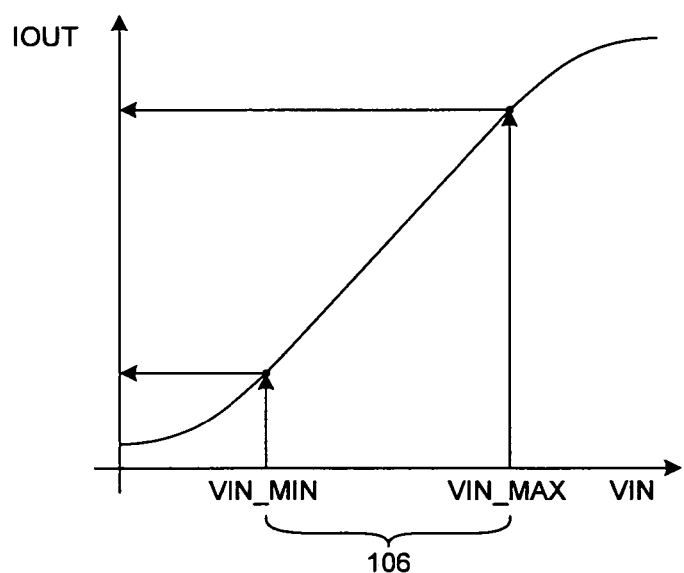
FIG. 4 is a diagram that illustrates a linear operating range of the current source of FIG. 3.

FIG. 4 is a waveform diagram of the voltage-to-current transfer function of the voltage-controlled current source 101. The middle range 106 of the input voltage VIN range has a linear voltage-in-to-current-out relationship. As the input voltage VIN is increased above this range, the rate of increase of current IOUT is not as great. The current source 100 is approaching its maximum current output. The voltage-to-current relationship is substantially non-linear for VIN voltages above VIN_MAX. Similarly, current source 101 exhibits a substantially non-linear voltage-to-current relationship for voltages VIN below VIN_MIN. The voltages VIN_MAX and VIN_MIN roughly demark the ends of the linear range of current source 101. In one novel aspect, an integrating ADC is provided on a microcontroller integrated circuit that operates in this linear range. The maximum magnitude of the input voltage VIN is VIN_MAX and the minimum magnitude of the input voltage VIN is VIN_MIN.

Figure 5:
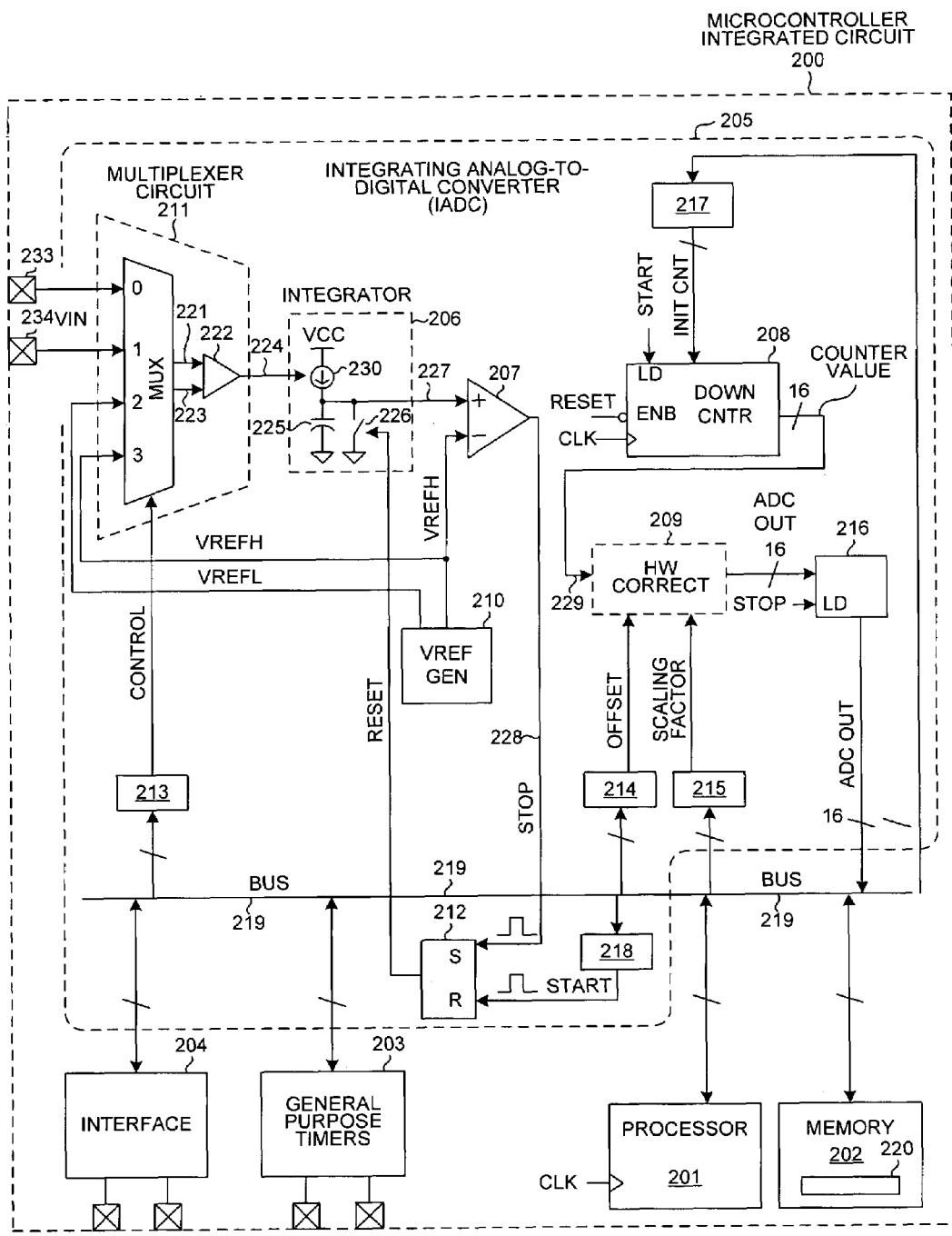
FIG. 5 is a block diagram of a microcontroller integrated circuit in accordance with one novel aspect.

FIG. 5 is a simplified diagram of a microcontroller integrated circuit 200 in accordance with this novel aspect. Novel microcontroller 200 includes a processor 201, a memory 202, general purpose timers 203, interface circuitry (for example, serial communication circuitry) 204, an integrating ADC 205, and a plurality of terminals including input terminals 233 and 234. Microcontroller 200 may be powered by a battery such that its supply voltage decreases as the battery ages. Integrating ADC 205 includes an integrator 206, a comparator 207, a down counter 208, a hardware correction circuit 209, a voltage reference generator circuit 210, analog multiplexer circuitry 211, a set-reset (SR) latch 212, five registers 213-217, and a one-shot circuit 218. Processor 201 can write to any of registers 213-215 and 217 and to one-shot circuit 218 via parallel bus 219. Processor 201 can read from register 216 via parallel bus 219.

Figure 6:
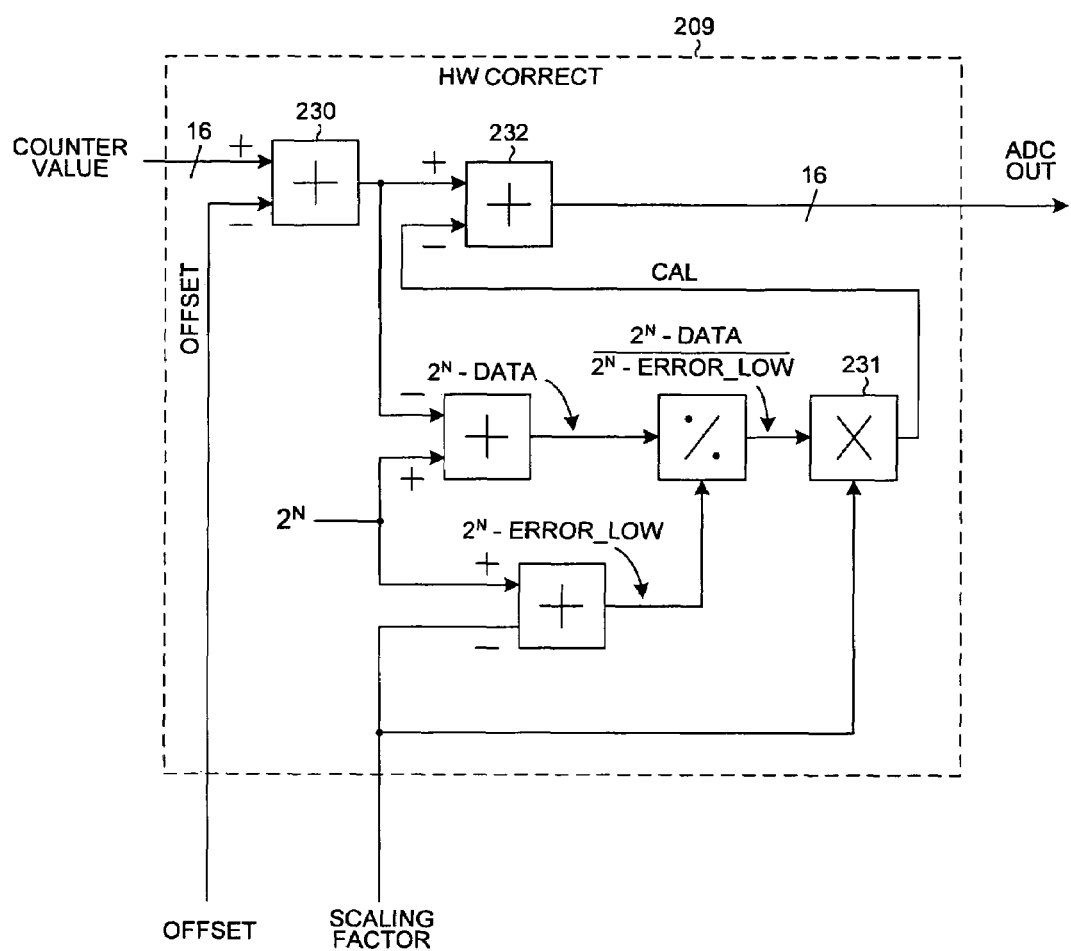
FIG. 6 is a more detailed diagram of one way to implement the hardware correction circuit of FIG. 5.

FIG. 6 is a block diagram that illustrates one way to implement the hardware correction circuit 209 of FIG. 5.

FIGS. 7 and 8 illustrate a novel calibration operation. Initially, processor 201 executes a calibration program 220 of processor-executable instructions. Execution of this program causes processor 201 to write a control value into register 213 such that multiplexer 211 couples its data input lead "3" to the upper data input lead 221 of buffer 222. Multiplexer 211 is constructed such that when the "3" data input lead is selected by the appropriate value of signal CONTROL, then ground potential is supplied onto the lower data input lead 223 of buffer 222. Buffer 222 is a unity voltage gain buffer. Buffer 222 therefore supplies the reference voltage VREFH onto the input lead 224 of integrator 206. Capacitor 225 at this time is discharged, because switch 226 is closed because the signal RESET is asserted to a digital logic high level by SR latch 212. Capacitor 225 is a 2 pF metal-to-metal integrated capacitor. Node 227 is at ground potential. Ground potential is therefore on the non-inverting input lead of comparator 207 and the reference voltage VREFH is on the inverting input lead of comparator 207. Comparator 207 therefore maintains the signal STOP on conductor 228 at a digital logic low level. Processor 201 writes an initial count value INIT CNT into register 217. Processor 201 writes values into register 214 and register 215 such that a value on the input leads 229 of the hardware correction circuit 209 passes through hardware correction circuit 209 unaltered. Accordingly, processor 201, by reading register 216, can read the sixteen-bit counter output value that is output by counter 208.

In one example, processor 201 writes a zero into register 214 and a digital zero into register 215. As can be seen from FIG. 6, if OFFSET is zero, then adder 230 subtracts nothing from the input counter value. If SCALING FACTOR is zero, then multiplier 231 multiplies by zero such that the value CAL is zero. The counter value output from adder 230 therefore passes through adder 232 unaltered. The value ADC OUT is therefore the same as the value COUNTER VALUE.

Next, program 220 causes processor 201 to write to one-shot 218. One-shot 218 responds by outputting a high START pulse of a predetermined duration. This high START pulse resets latch 212 such that the signal RESET transitions to a digital low. Switch 226 therefore opens. Current source 230 begins to charge capacitor 225 such that the voltage on node 227 begins to increase. The rate of increase is dependent upon the magnitude of the voltage on the input lead 224 of integrator 230.

The signal START is also supplied onto the load-input lead of counter 208. The high START pulse causes counter 208 to be loaded with the initial count value INIT CNT that was previously written into register 217. The low level of the signal RESET causes counter 208 to begin counting down from the initial count value.

The counting of down counter 208 continues until the voltage on node 227 reaches the voltage VREFH. Comparator 207 then asserts the signal STOP to a digital logic high. The low-to-high transition of the signal STOP both sets latch 212 and also causes the counter value that is output by counter 208 to be loaded into register 216. Processor 201 then reads the counter value from register 216. This counter value is the counter value that results when VREFH is supplied onto the input lead 224 of integrator 206. In the present ADC, VREFH is a voltage at the upper end of the linear region of the current source 230 of integrator 206. At this input voltage VREFH, IADC 205 is to output a value of $2^N$, where N is a value less than the number of bits of counter 208. Counter 208 may, for example, be a seventeen-bit down counter, and N may be sixteen. Processor 201 therefore subtracts $2^N$ from the counter value read from register 216 to determine the offset between the two values. Processor 201 writes this value OFFSET into register 214.

FIG. 7 illustrates this process of determining the value OFFSET. The DATA HIGH value is the counter value read out of register 216 when the VIN_MAX value (VREFH in this example) is supplied onto the input lead 224 of integrator 206. The value OFFSET represents the difference between DATA HIGH and $2^N$.

Next, program 220 causes processor 201 to write a value into register 213 so that multiplexer 211 couples data input lead "2" to upper data input lead 221 of buffer 222. When multiplexer 211 is selected in this fashion, VREFL is coupled onto the upper data input lead 221 of buffer 222 and ground potential is coupled onto the lower data input lead 223 of buffer 222. Buffer 222 therefore supplies the VREFL voltage onto the input lead 224 of integrator 206. In this example, VREFL is the voltage VIN_MIN at the lower end of the linear range of integrator 206. The process described above of loading INIT CNT and then starting an ADC conversion operation is then conducted. Due to the low voltage (VREFL) on the input lead of integrator 206, the voltage on node 227 increases more slowly than it did in the first case when VREFH was present on the input lead of integrator 206. Counter 208 therefore counts down for a longer amount of time until the voltage on node 227 reaches VREFH. When the voltage on node 227 reaches VREFH, then comparator 207 asserts the signal STOP. The counter value output from counter 208, due to the value OFFSET being in register 214, is reduced in magnitude by the value OFFSET. The result is loaded into register 216 upon assertion of the signal STOP. Processor 201 reads this offset-adjusted value from register 216. IADC 205 is to output a sixteen-bit output value of zero when the VIN_MIN value (VREFL in this case) is supplied onto the input lead 224 of integrator 206. Rather than IADC 205 outputting a zero value, IADC 205 outputs another value DATA LOW. FIG. 7 illustrates this offset-adjusted output value DATA LOW. The difference between DATA LOW and the desired count value of zero (a sixteen-bit zero) is referred to as ERROR_LOW.

FIG. 7 illustrates the transfer function of IADC 205 when hardware correction circuit 209 only performs the OFFSET subtract operation. The linear region of the transfer function denoted by dashed line 300 is offset in the vertical dimension such that when the VIN is VREFH, then IADC 205 outputs the desired $2^N$ count. When VIN is VREFL, however, then IADC 205 outputs the offset-adjusted value DATA LOW rather than the desired zero output value. What is desired is a scaling factor that does not affect the ADC output when VIN is VREFH, but proportionally affects the ADC output value more as the VIN voltage decreases such that if VIN is VREFL then the ADC output value is corrected to be zero.

FIG. 8 illustrates the result of applying this scaling factor. Dashed line 301 represents how IADC 205 converts voltages VIN into output values when hardware correction circuit only performs the offset adjust function. Line 302 represents the result of the desired scaling operation. To shift a value from offset-adjusted line 301 to a corresponding value on line 302, the value on offset-adjusted line 301 is to be operated on by an appropriate scaling factor.

FIG. 9 illustrates one way that such a scaling factor can be determined. The value DATA is a value output from adder 230 of the hardware correction circuit 209 (the value on offset-adjusted line 301). The value ADC_DATA_COR is the corrected ADC output value on line 302 that corresponds with the value DATA on line 301. Processor 201 determines SCALING FACTOR in accordance with the equation of FIG. 9 and the circuitry of FIG. 6. In the present example, SCALING FACTOR is the value ERROR_LOW as indicated by the circuit of FIG. 6. Processor 201 writes the determined SCALING FACTOR value into register 215. IADC 205 is now calibrated.

Figure 10:
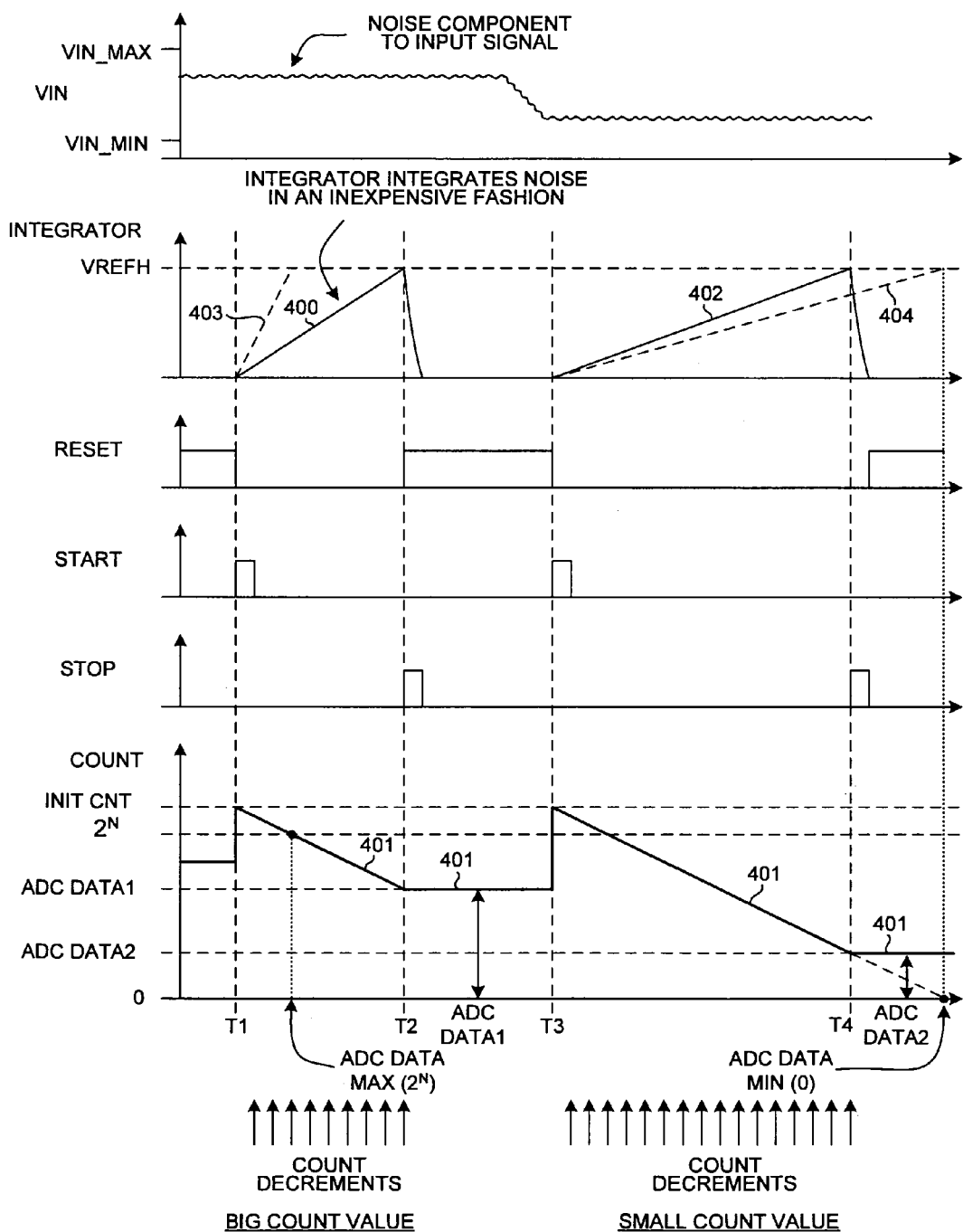
FIG. 10 is a diagram of waveforms that illustrate an operation (after calibration) of the IADC of the microcontroller of FIG. 5.

FIG. 10 is a simplified waveform diagram that illustrates two subsequent ADC conversions performed by IADC 205 of FIG. 5. Processor 201 writes an appropriate control value into a register 213 so that multiplexer 211 is controlled to couple input terminal 233 to input lead 221 and to couple input terminal 234 to input lead 223. In the first conversion, a comparatively high differential input voltage is present between the VIN input terminals 233 and 234. This high value of VIN causes the voltage on node 227 to increase relatively rapidly as indicated by slope 400. Counter 208 starts counting down at time T1 and counts down from the initial count value as long as the voltage on node 227 is below VREFH. The voltage on node 227 increases and reaches VREFH at time T2. The resulting counter value as output by counter 208 has the OFFSET value subtracted from it by the adder in the hardware correction circuit 209. The offset-adjusted value is then scaled in hardware correction circuit 209 using the SCALING FACTOR. The resulting corrected value ADC DATA1 is loaded into register 216 at time T2. The corrected counter value as output from hardware correction circuit 209 is represented in FIG. 10 by heavy line 401. The flat portion of line 401 following time T2 indicates that the down counter 208 has stopped decrementing when RESET is a digital logic high after time T2.

In the second conversion, a comparatively low differential input voltage is present between the VIN input terminals 233 and 234. This low value of VIN causes the voltage on node 227 to increase relatively slowly as indicated by slope 402. Counter 208 starts counting down at time T3 and counts down from the initial counter value as long as the voltage on node 227 is below VREFH. The voltage on node 227 reaches VREFH at time T4. The resulting counter value has the OFFSET value subtracted from it by adder 230 in the hardware correction circuit 209. The SCALING FACTOR and the rest of the hardware correction circuit 209 is then used to scale the offset-adjusted value. The resulting scaled value ADC DATA2 is loaded into register 216 at time T4.

When the maximum VIN voltage (VIN_MAX) permitted (VREFH in this example) is present between terminals 206 and 207, then the resulting ADC OUT value has a value of $2^N$ as desired. This is indicated in FIG. 10 by the arrow ADC DATA MAX ($2^N$). The corresponding greatest allowable slope of the voltage on node 227 is indicated by dashed line 403. The maximum VIN voltage VIN_MAX is illustrated on the vertical axis of the upper waveform of FIG. 10.

When the minimum VIN voltage (VIN_MIN) permitted (VREFL) is present between terminals 206 and 207, then the resulting ADC OUT value has a value of zero as desired. This is indicated in FIG. 10 by the arrow ADC DATA MIN (0). The corresponding smallest allowable slope of the voltage on node 227 is indicated by dashed line 404. The minimum VIN voltage VIN_MIN is illustrated on the vertical axis of the upper waveform of FIG. 10.

Figure 11:
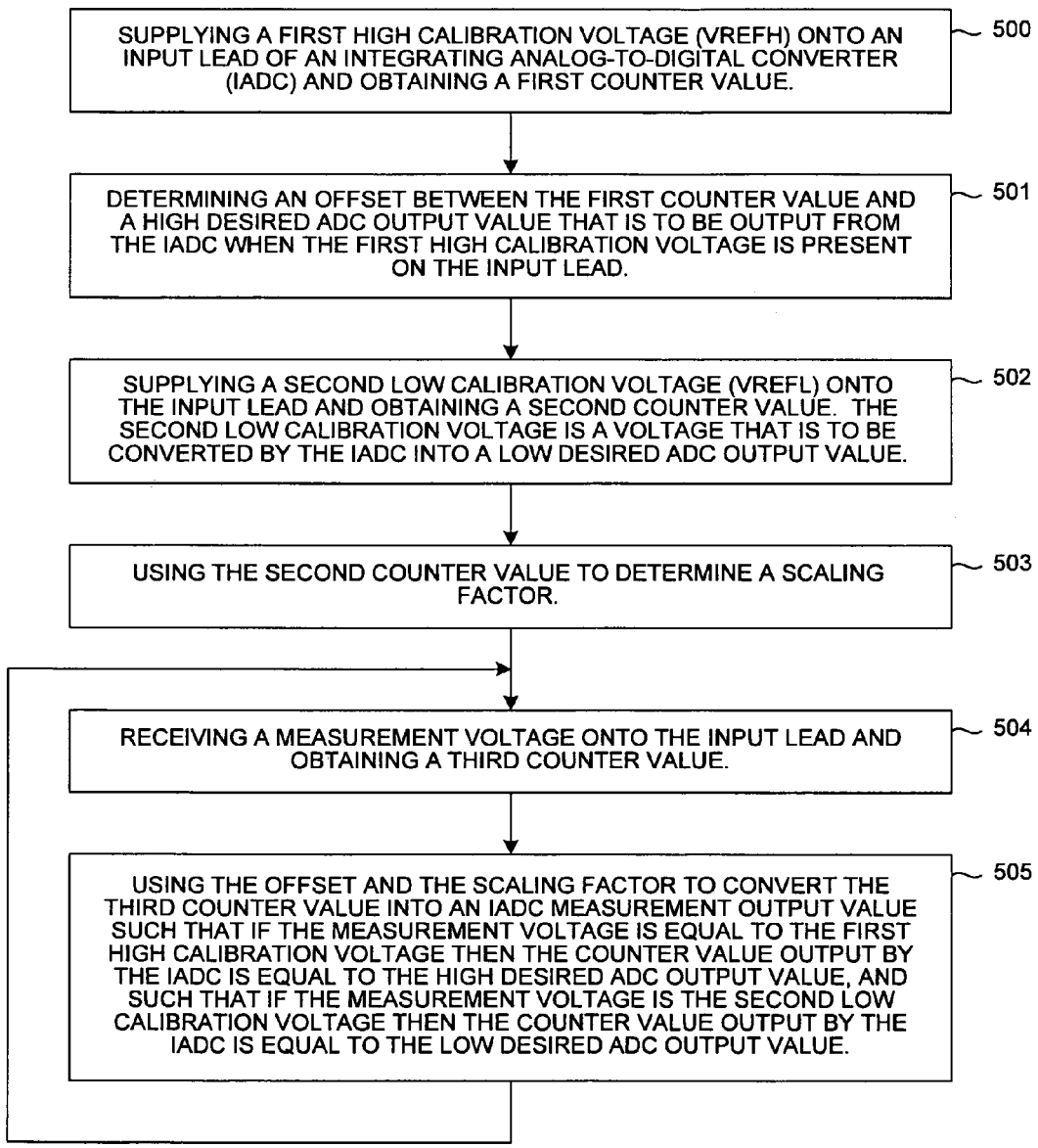
FIG. 11 is a flowchart that illustrates the in-situ autocalibration method set forth in connection with FIG. 5.

FIG. 11 is a flowchart of a novel method of calibrating and operating microcontroller 205 of FIG. 5. Initially (step 500), a first high calibration voltage (for example, VREFH) is supplied onto the input lead 227 of an integrating ADC. The ADC performs a conversion and a first counter value is obtained. Processor 201 then determines an offset between the first counter value and a high desired ADC output value (for example, $2^N$).

A second low calibration voltage (for example, VREFL) is then supplied onto the input lead 227 of the integrating ADC. The second low calibration voltage (for example, ground potential) is a voltage that is to be converted by the integrating ADC into a low desired ADC output value (for example, zero). The ADC performs a conversion and a second counter value is obtained.

Next (step 503), the second counter value is used to determine a scaling factor. The scaling factor is such that when it is applied to an offset-corrected counter value under the condition when the first high calibration voltage is on the ADC input terminals, the scaling factor has no affect. The scaling factor is such that when it is applied to an offset-corrected counter value under the condition when the second low calibration voltage is on the ADC input terminals, the result of applying the scaling factor is the low desired ADC output value (for example, zero). The offset determined in step 501 and the scaling factor determined in step 503 are written into registers 214 and 215 of FIG. 5, respectively. The IADC 205 is then calibrated.

When the integrating ADC operates normally following calibration, an input voltage VIN to be measured (referred to here as a "measurement voltage") is received (step 504) onto the input terminals 233 and 234. The ADC performs a conversion and the resulting counter value as output by counter 208 is processed by hardware correction circuit 209. Adder 230 in hardware correction circuit 209 first subtracts the offset value OFFSET in register 214 from the output of counter 208, and then the remainder of hardware correction circuit 209 scales the output of adder 230 to generate the value ADC OUT that is loaded into register 216. The integrator operates in its linear region of operation because the highest VIN voltage that can be supplied into the ADC is VREFH (at the upper end of the linear region of the integrator) and because the lowest VIN voltage that can be supplied into the ADC is VREFL (at the lower end of the linear region of the integrator). If VIN is of magnitude VREFH, then the ADC outputs a value of $2^N$ as desired. If VIN is of magnitude VREFL, then the ADC outputs a value of zero as desired.

In the example described above, hardware correction circuit 209 involves an adder that is used to subtract the value OFFSET from the output of counter 208. In another example, there is no such adder, but rather the value OFFSET as determined by processor 201 is used to adjust the initial counter value INIT CNT. Rather than generating a counter value and then subtracting the value OFFSET from the output of the counter, the initial count value is increased by the value OFFSET so no adder is required. Although the specific circuit of FIG. 5 involves a hardware correction circuit 209, the integrating ADC 205 can be realized without such special hardware. Processor 201 can simply read the output of counter 208 and use its ALU (arithmetic logic unit) to perform the addition, subtraction, multiplication and/or division operations that are performed by hardware correction circuit 209 in the specific circuit of FIG. 5.

Figure 12:
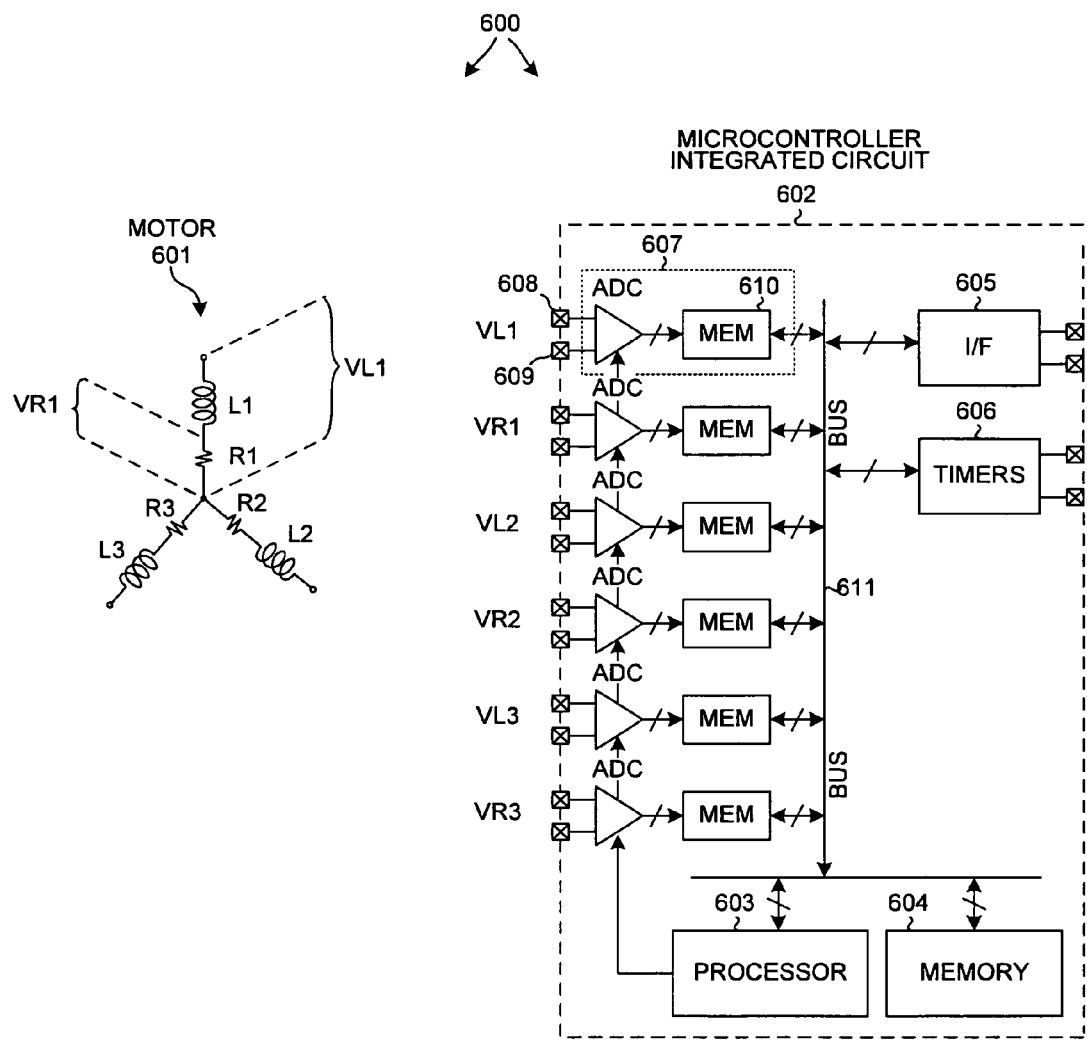
FIG. 12 is a simplified diagram of a motor control system that involves a microcontroller integrated circuit in accordance with a second novel aspect.

FIG. 12 is a simplified diagram of a novel system 600 involving a motor 601 and a novel microcontroller integrated circuit 602. Microcontroller 602 includes a processor 603, memory 604, interface circuitry 605 (for example, a serial interface), timers 606, and a plurality of integrating ADC circuits. Each of the integrating ADC circuits is of the type set forth in FIG. 5. Each integrating ADC receives a differential input voltage on two associated terminals and converts the differential voltage into a digital value. Integrating ADC 607, for example, receives a differential input voltage on terminals 608 and 609, performs an analog-to-digital conversion, and writes the resulting digital value into memory 610.

Motor 601 in this example is a high speed motor whose rotor can rotate at 10,000 RPM. Microcontroller 602 makes six measurements at the same time. The current flowing through each of the three windings is to be determined by measuring the voltage drops across resistors R1, R2 and R3. These voltages VR1, VR2 and VR3 are therefore illustrated as the inputs to three of the six integrating ADCs of integrated circuit 602. The voltage dropped across each of the three windings is also to be measured at the same time. These voltages VL1, VL2 and VL3 are therefore illustrated as the inputs to the remaining three of the six integrating ADCs of integrated circuit 602. The six integrating ADCs simultaneously perform ADC conversions and load their digital outputs into their respective memories (registers). Processor 603 then reads these conversion values out of the memories across bus 611. In a conventional approach, a single high speed ADC would be typically be provided and would be run to take all the measurements in as close to the same time as possible. Regardless of how fast this conventional ADC circuit is, however, it cannot take the measurements at precisely the same time. A single ADC takes the measurements sequentially. Providing a high speed ADC in an attempt to take fast measurements so that the sequential measurements are taken close in time may make the ADC an expensive circuit. Moreover, if ADCs of the types typically found on microcontrollers are used, then six such ADCs could consume a considerable amount of integrated circuit area. In the novel system 600 of FIG. 12, on the other hand, numerous small self-calibrating integrating ADCs are provided. Each integrating ADC circuit is realized in a relatively small amount of integrated circuit area as compared to a large and complex SAR ADC. By using six small integrating ADCs as opposed to one larger but faster ADC, the six measurements are all taken at the same time.

Although the present invention has been described in connection with certain specific embodiments for instructional purposes, the present invention is not limited thereto. Although a hardware correction circuit is described above that involves a hardware divider, in other examples of the hardware correction circuit there is no hardware divider. Test equipment during production test reads the ERROR_LOW value from the microcontroller, and subtracts this ERROR_LOW value from 2N to obtain a sum. The test equipment then calculates one divided by the sum to obtain a precalculated scaling factor. The tester stores precalculated scaling factor in memory on the microcontroller for later use by the hardware correction circuit when the IADC performs analog-to-digital conversions in normal operation. The technique of precalculating this more complex scaling factor and storing it for later use during IADC normal operation reduces the amount of hardware required to realize the hardware correction circuit. Accordingly, various modifications, adaptations, and combinations of various features of the described embodiments can be practiced without departing from the scope of the invention as set forth in the claims.

What is claimed is:

1. A method comprising:
   (a) supplying a first high calibration voltage onto an input lead of an integrating analog-to-digital converter (IADC) and obtaining a first counter value, wherein the first counter value is a counter value output by a counter in the IADC;
   (b) determining an offset between the first counter value and a high desired ADC output value that is to be output from the IADC when the first high calibration voltage is present on the input lead;
   (c) supplying a second low calibration voltage onto the input lead and obtaining a second counter value from the counter value from the counter, wherein the second low calibration voltage is a voltage that is to be converted by the IADC into a low desired ADC output value;

(d) using the second counter value to determine a scaling factor;

(e) receiving a measurement voltage onto the input lead and obtaining a third counter value; and (f) using the offset and the scaling factor to convert the third counter value into a measurement ADC output value, wherein if the measurement voltage is equal to the high desired ADC output value, and wherein if the measurement voltage is equal to the second low calibration voltage then the measurement ADC output value is equal to the low desired ADC output value.

2. The method of claim 1, wherein (d) involves subtracting the offset from the second counter value to determine an ERROR_LOW value, and then using the ERROR_LOW value in a calculation to determine the scaling factor.

3. The method claim 2, wherein the offset is subtracted in (f) from the third counter value after the third counter value has been generated by the counter.

4. The method of claim 1, wherein the IADC is part of a microcontroller integrated circuit, wherein the microcontroller integrated circuit further comprises a processor, the processor performing calculations to determine the offset and the scaling factor.

5. The method claim 4, wherein the microcontroller further comprises a terminal and a multiplexer, the method further comprising:

(g) controlling the multiplexer such that the measurement voltage is coupled from the terminal, through the multiplexer, and onto the input lead in step (e).

6. The method claim 1, wherein the offset is used in (f) to set an initial count value into the counter before the counter generates the third counter value.

7. The method claim 1, wherein the IADC is part of an integrated circuit, wherein the first high calibration voltage and the second low calibration voltage are generated within the integrated circuit.

8. A microcontroller integrated circuit, comprising:
a terminal;
an integrating analog-to-digital converter (IADC); and
a processor that executes instructions, wherein the processor can read a value output by the IADC, the IADC comprises:
an in-situ autocalibration functionality;
a source of a first high calibration voltage and a second low calibration voltage;
an integrator;
a counter that counts during a time the integrator is integrating; and
a multiplexer circuit that is controllable by the processor to couple the first high calibration voltage onto an input lead of the integrator, to couple the second low calibration voltage onto the input lead of the integrator, and to couple a voltage on the terminal onto the input lead of the integrator.

9. A microcontroller integrated circuit, comprising:
a terminal;
an integrating analog-to-digital converter (IADC) having an in-situ autocalibration functionality; and
a processor that can read a value output by the IADC, wherein the IADC comprises:
a source of a first high calibration voltage and a second low calibration voltage;
an integrator that includes a voltage-controlled current source and a capacitor, wherein the voltage-controlled current source has a substantially linear operating range of input voltages and a substantially non-linear operating range of input voltages, and wherein the IADC is operated such that the integrator is operated in the substantially linear operating range and is not operated in the substantially non-linear operating range;
a counter that counts during a time the integrator is integrating; and
a multiplexer circuit that is controllable by the processor to couple the first high calibration voltage onto an input lead of the integrator, to couple the second low calibration voltage onto the input lead of the integrator, and to couple a voltage on the terminal onto the input lead of the integrator.

10. The microcontroller integrated circuit of claim 9, wherein the substantially linear operating range of input voltages is between the first high calibration voltage and the second low calibration voltage.

11. A microcontroller integrated circuit, comprising:
an integrating analog-to-digital converter (IADC) having an in-situ autocalibration functionality; and
a processor that executes instructions, wherein the processor can read a value output by the IADC, wherein the in-situ autocalibration functionality is employed such that the IADC will convert a first predetermined analog input voltage into a first predetermined desired digital output value, and such that the IADC will convert a second predetermined analog input voltage into a second predetermined desired digital output value, the first and second predetermined analog input voltages being voltages that are present on an input terminal of the microcontroller integrated circuit.

12. A microcontroller integrated circuit, comprising:
an integrating analog-to-digital converter (IADC) having an in-situ autocalibration functionality, wherein the in-situ autocalibration functionality is employed such that the IADC will convert a first predetermined analog input voltage into a first predetermined desired digital output value, and such that the IADC will convert a second predetermined analog input voltage into a second predetermined desired digital output value, the first and second predetermined analog input voltages being voltages that are present on an input terminal of the microcontroller integrated circuit; and
a processor that can read a value output by the IADC.

13. The microcontroller integrated circuit of claim 12, wherein the IADC comprises a hardware correction circuit that involves a hardware adder, and wherein the hardware correction circuit is used to adjust the digital value output from a counter.

14. The microcontroller integrated circuit of claim 13, wherein the hardware correction circuit uses a hardware divider to adjust the digital value output from the counter.

15. The microcontroller integrated circuit of claim 13, wherein a pre-calculated scaling factor is stored in a memory, and wherein the pre-calculated scaling factor is used by the hardware correction circuit to adjust the digital value output from the counter.

16. The microcontroller integrated circuit of claim 12, wherein the processor is used to adjust the initial value on a counter.

17. A microcontroller integrated circuit, comprising:
an integrating analog-to-digital converter (IADC) having an in-situ autocalibration functionality;
a processor that can read a value output by the IADC; and a plurality of substantially identical integrating analog-to-digital converters (IADC), wherein each IADC of the plurality has an in-situ autocalibration functionality.

18. A microcontroller integrated circuit, comprising:

a terminal;

an integrating analog-to-digital converter (IADC) having an in-situ autocalibration functionality; and a processor that can read a value output by the IADC, wherein the IADC comprises:

a source of a first high calibration voltage and a second low calibration voltage;

an integrator;

a counter that counts during a time the integrator is integrating;

a multiplexer circuit that is controllable by the processor to couple the first high calibration voltage onto an input lead of the integrator, to couple the second low calibration voltage onto the input lead of the integrator, and to couple a voltage on the terminal onto the input lead of the integrator; and a hardware correction circuit that receives an output of the counter, performs an arithmetic operation on the output of the counter, and outputs the value output by the IADC, wherein the hardware correction circuit is controllable by the processor.

19. A microcontroller integrated circuit comprising:

a processor that executes instructions;

an integrating analog-to-digital converter (IADC); and autocalibrating circuitry that in-situ calibrates the IADC such that if an input voltage received onto the microcontroller integrated circuit has a first predetermined analog input voltage then the IADC outputs a first predetermined desired digital output value, wherein the autocalibrating circuitry includes a multiplexer that is controllable; 1) to couple the first predetermined analog input voltage onto an input lead of an integrator within the IADC, or 2) to couple an analog voltage on a terminal of the microcontroller integrated circuit onto the input lead of the integrator.

20. A microcontroller integrated circuit comprising:

a processor that executes instructions;

an integrating analog-to-digital converter (IADC); and autocalibrating circuitry that in-situ calibrates the IADC such that if an input voltage received onto the microcontroller integrated circuit has a first predetermined analog input voltage then the IADC outputs a first predetermined desired digital output value, wherein the first predetermined analog input voltage is not received onto the microcontroller integrated circuit but rather is a non-zero reference voltage generated by a circuit on the microcontroller integrated circuit.

21. A method comprising:

coupling an input lead of an integrating analog-to-digital converter (IADC) to receive a first predetermined analog input voltage and thereby obtaining a first data value that is output from the IADC, wherein the IADC is part of a microcontroller integrated circuit, wherein the IADC includes an analog multiplexer and a voltage reference generator circuit and an integrator, the voltage reference generator circuit generating the first predetermined analog input voltage and the second predetermined analog input voltage, wherein the microcontroller integrated circuit also comprises a processor that executes instructions, the processor controlling the analog multiplexer during an in-situ calibration operation to couple a selected one of the first and second predetermined analog input voltages onto an input lead of the integrator;

coupling the input lead of the IADC to receive a second predetermined analog input voltage and thereby obtaining a second data value that is output from the IADC; and using the first and second data values to calibrate the IADC such that if the first predetermined analog input voltage is supplied onto the input lead then the IADC will output a first predetermined desired digital output value and such that if the second predetermined analog input voltage is supplied onto the input lead then the IADC will output a second predetermined desired digital output value.

* * * * *